United States Patent [19]
Hosono

[11] Patent Number: 5,085,957
[45] Date of Patent: Feb. 4, 1992

[54] METHOD OF REPAIRING A MASK

[75] Inventor: Kunihiro Hosono, Itami, Japan

[73] Assignee: Mitsubishi Denki Kabushiki Kaisha, Japan

[21] Appl. No.: 566,114

[22] Filed: Aug. 13, 1990

[30] Foreign Application Priority Data

Apr. 18, 1990 [JP] Japan ................... 2-100357

[51] Int. Cl.5 ............................................. G03F 9/00
[52] U.S. Cl. ..................................... 430/5; 430/323;
250/492.2; 250/398; 156/646; 156/DIG. 111;
359/29
[58] Field of Search ................ 430/5, 323; 250/492.2,
250/398; 350/3.82; 156/646, DIG. 111

[56] References Cited

U.S. PATENT DOCUMENTS

| | | | |
|---|---|---|---|
| 4,037,918 | 7/1977 | Kato | 350/3.82 |
| 4,457,803 | 7/1984 | Takigawa | 156/626 |
| 4,548,883 | 10/1985 | Wagner | 430/5 |
| 4,698,236 | 10/1987 | Kellogg et al. | 430/5 |
| 4,874,460 | 10/1989 | Nakagawa et al. | 156/646 |
| 4,902,899 | 2/1990 | Lin et al. | 430/5 |
| 4,930,439 | 6/1990 | Sato et al. | 250/398 |
| 4,939,364 | 7/1990 | Ishitani et al. | 250/492.2 |

FOREIGN PATENT DOCUMENTS

| | | | |
|---|---|---|---|
| 0090924 | 10/1083 | European Pat. Off. | 430/5 |
| 129423 | 7/1984 | Japan | 430/5 |

OTHER PUBLICATIONS

Levenson, Mark D. et al., IEEE Transactions on Electronic Devices, vol. ED-29, No. 12, Dec. 1982, "Improving Resolution in Photolithography with a Phase--Shifting Mask".

Primary Examiner—Richard L. Schilling
Assistant Examiner—Thomas R. Neville
Attorney, Agent, or Firm—Leydig, Voit & Mayer

[57] ABSTRACT

A mask repair method in which a transparent defect of in a phase shifter pattern is repaired by ion beam etching instead of a shifter pattern film deposition. A portion of the mask substrate below the transparent defect region is etched with an ion beam to a depth such that the phase of light passing through the adjacent transparent pattern regions and the phase of light passing through the etched region are opposite to each other. This mask repairing method enables high-contrast exposure and ensures high working accuracy since the repairing process is based on etching alone.

3 Claims, 4 Drawing Sheets

METHOD OF REPAIRING A MASK

BACKGROUND OF THE INVENTION

1. FIELD OF THE INVENTION

This invention relates to a method of repairing a mask and, more particularly, to a method of repairing a shifter pattern defect or more specifically a clear defect of a phase shifting mask used in a photolithography process for manufacture of semiconductor elements.

2. DESCRIPTION OF RELATED ART

The resolution limit R ($\mu$m) of a lithography technique using an optical contraction type stepper is expressed as $$R = k_1 \lambda / NA, \quad k_1 = 0.5$$

where $\lambda$ represents wavelength ($\mu$m) and NA represents the numerical aperture of the lens. In accordance with this equation, resolution limit of the optical lithography is minimized by reducing the exposure wavelength, increasing the value of NA and/or reducing the constant $k_1$ of the resist dependent upon the process. Presently, a stepper using i-line ($\lambda = 0.365$ $\mu$m) and having NA$=0.5$ is available and $k_1 = 0.5$ is possible. A resolution of about 0.4 $\mu$m is thereby attained. To further reduce the resolution limit, the exposure wavelength may be reduced or the value of NA may be increased. However, technical difficulties in obtaining a suitable light source and a suitable lens and a reduction in the depth of focus $\delta = \lambda / 2NA^2$ are thereby encountered.

To overcome these problems, a phase shift exposure method has been proposed. Examples of this method are disclosed in Japanese Published Patent Applications 57-62052 and 58-173744.

FIGS. 1A to 1C show the principle of a conventional photomask method and FIGS. 2A to 2C show the principle of the phase shift exposure method. FIGS. 1A and 2A are sectional side views of mask substrates, FIGS. 1B and 2B show the strengths of electric fields on masks, and FIGS. 1C and 2C show the intensity of light on wafers.

First, these methods will be described below with respect to transfer of a pattern finer than the optical lithography resolution limit. In the case of the photomask method, the electric fields of the light passing between mask patterns (main patterns) 2 of a mask formed on a mask substrate 1 (formed of, e.g., SiO$_2$) are spatially separated from each other as indicated by FIG. 1B. However, the light intensity (FIG. 1C) of the light transmitted through the optical system onto the wafer (not shown) is continuously distributed, and it is not possible to form the pattern image.

On the other hand, in the phase shift method, pattern transfer is effected by using a mask having phase shifting patterns (shifter) 3 which are SiO$_2$ films or the like formed at alternate pattern spaces 2a of a mask pattern 2, as shown in FIG. 2A. The shifter patterns 3 shift the phase of light through 180°. The electric fields of the light passing through this mask are as shown in FIG. 2B, with their phases alternately inverted. If the pattern images of this mask are projected by using the same light source as the photomask method, the amounts of light respectively forming the image patterns are cancelled out at the positions where the image patterns overlap, because the phases of the overlapping light are opposite to each other. A split intensity pattern such as that shown in FIG. 2C is thereby obtained. For this reason, the phase shift exposure method ensures a higher resolution in comparison with the photomask method, as confirmed by experiment, and reduces the minimum pattern resolution width by substantially by half.

Next, a method of repairing pattern defects of the phase shifting mask used in accordance with the phase shift exposure method will be described below. FIGS. 3A to 3C show the principle of a method of repairing an opaque defect of phase shifter patterns, and FIGS. 4A to 4C show the principle of a method of repairing a transparent defect of phase shifter patterns. Details of a mask substrate 1 and other members shown in these figures are as described below. Mask patterns 2 formed of Cr or MoSi are provided on the mask substrate 1. Phase shifter patterns 3 formed of SiOx or PMMA (polymethylmethacrylate) are formed at predetermined positions between the mask patterns 2. A reference numeral 4 in FIG. 3A designates an opaque defect region of the phase shifter pattern 3. The opaque defect region 4 is formed of SiOx or PMMA like the phase shifter pattern 3.

This opaque defect is repaired as described below. As shown in FIG. 3B, the opaque defect region 4 is irradiated and scanned with a focused ion beam (FIB) 5, etched (milled), and removed. For example, a 1 $\mu$m$^2$ defect can be removed in several minutes by using a 30 keV Ga$^+$ ion beam (beam current: 300 pA). PMMA is regarded as more suitable for forming the phase shifter patterns 3 in consideration the detection of etching end points. This is because secondary ions are used to detect the end points and because the change in the yield of secondary ions at each end point is small if a material such as SiOx similar to the material of the mask substrate 1 is used. FIG. 3C shows the result of repair of the opaque defect. Residues 4a of the opaque defect are left on the mask patterns 2, which is unimportant since the mask patterns 2 are not optically transmissive.

A method of repairing a transparent defect will be described below with reference to FIGS. 4A to 4C. A reference numeral 6 in FIG. 4A designates a clear defect region to be repaired. To repair this clear defect, the transparent defect region 6 is irradiated with an ion beam 5 in a reactive gas atmosphere to deposit a shifter material 7 on the transparent defect region 6, as shown in FIG. 4B. This method is a film deposition method using the ion beam assist method. The same ion beam 5 used for the opaque repair is used to scan the transparent defect region 6 a plurality of times. During this scanning, a reactive gas is led through a nozzle 8 to a position in the vicinity of the transparent defect repair region and is blown out as a nozzle beam 9. The distance between the nozzle 8 and the mask substrate 1 is about several hundred microns, and the nozzle 8 is positioned so that the defect region is located just in front of the nozzle 8 in the axial direction of the same. SiH$_4$ and O$_2$ may be used for the reactive gas. These gases decompose and react with each other, and SiO$_2$ (or SiOx) is thereby deposited as the shifter material 7 on the clear defect region 6. FIG. 4C shows the result of repair of the transparent defect. Since SiOx is deposited in this case, the thickness of the shifter material layer is about 100 nm. Because the composition and the structure of deposited SiOx change according to the conditions of the irradiation of the ion beam 5, the reaction gas atmosphere and so on, it is necessary to control and optimize the thickness of the deposited SiOx.

The above-described mask repair method is disadvantageous as described below. A toxic and pyrophoric gas such as SiH4 is used to repair a transparent defect of phase shifter patterns. It is therefore necessary to provide a complicated gas supply apparatus to ensure security. This apparatus needs to be controlled carefully.

The film deposition method using the ion beam assist method is inferior in accuracy in comparison with the etching. There is therefore a problem that the accuracy of transparent defect repairs of phase shifter patterns are lower than the accuracy of opaque defect repairs.

SUMMARY OF THE INVENTION

In view of these problems, it is an object of the present invention is to provide a mask repair method using a simpler mask repair apparatus, which eliminates the need for using SiH4 or the like to enable mask repair operations to be performed with safety, and which improves the repair accuracy by etching.

To this end, the present invention provides a method of repairing a mask in which a transparent defect region of a phase shifting mask is irradiated with an ion beam to effect etching for repairing the transparent defect of the shifter patterns of the phase shifting mask, the method comprising etching a portion of the mask substrate below the transparent defect region to a depth such that the phase of light passing through the region in which the transparent defect is repaired is opposite to the phase of light passing through transparent pattern regions where no shifter patterns are formed.

DESCRIPTION OF THE PREFERRED EMBODIMENT

Figure 1A:
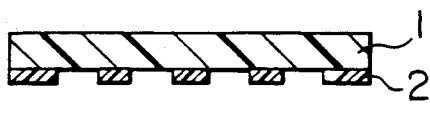
FIGS. 1A to 1C are schematic views showing the principle of a conventional photomask method.
Figure 2A:
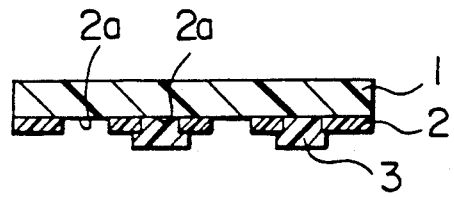
FIGS. 2A to 2C are schematic views showing the principle of a conventional phase shift exposure method.
Figure 1B:
Figure 2B:
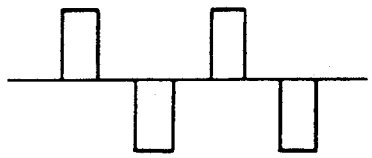
Figure 1C:
Figure 2C:
Figure 3A:
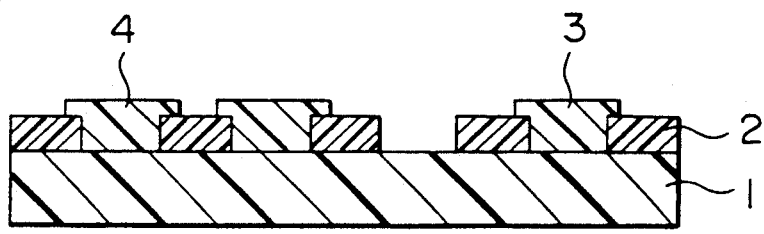
FIGS. 3A to 3C are cross-sectional views showing the principle of a method of repairing an opaque defect relating to the conventional phase shift exposure method.
Figure 3B:
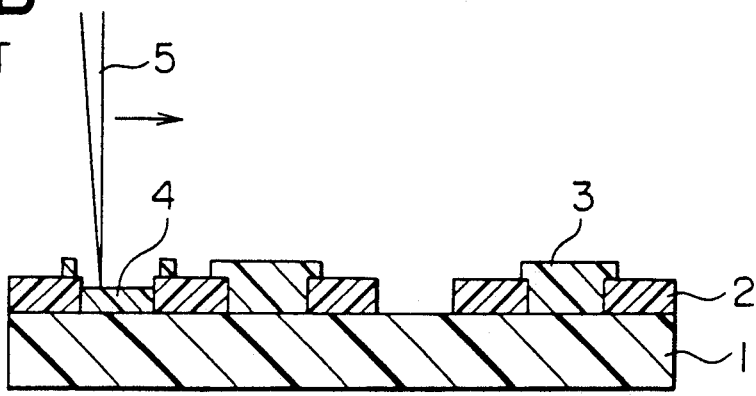
Figure 3C:
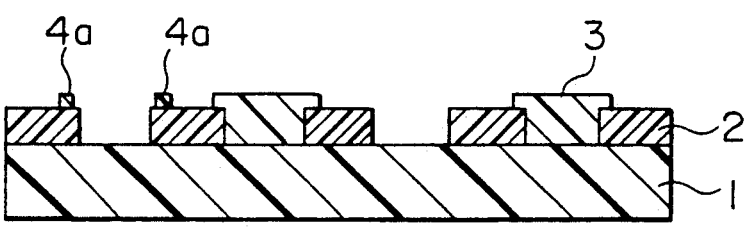
Figure 4A:
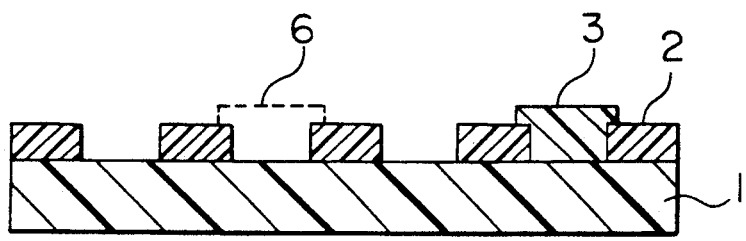
FIGS. 4A to 4C are cross-sectional views showing the principle of a method of repairing a transparent defect relating to the conventional phase shift exposure method.
Figure 4B:
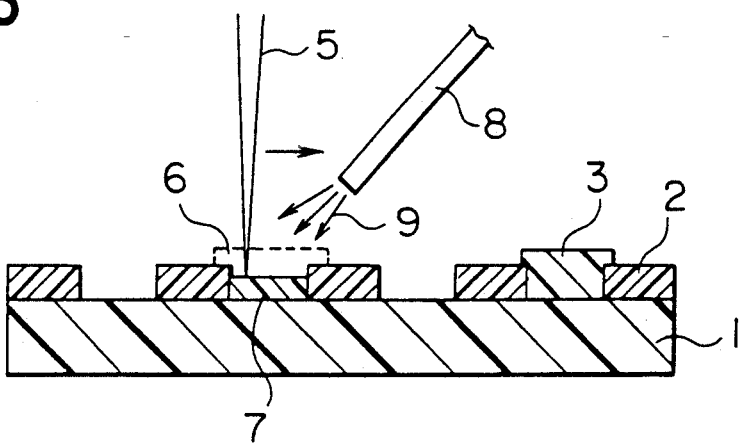
Figure 4C:
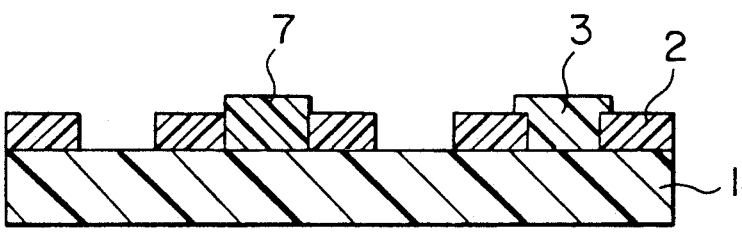
Figure 5A:
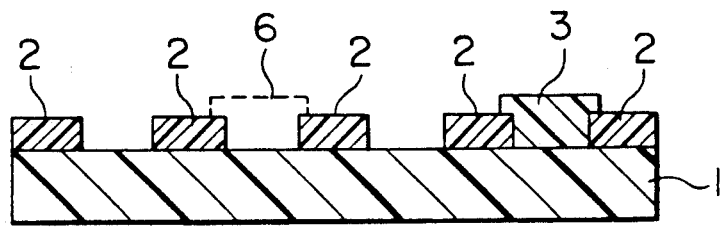
FIGS. 5A to 5C are cross-sectional views showing the principle of a method of repairing a transparent defect of phase shifter patterns in accordance with an embodiment of the present invention.
Figure 5B:
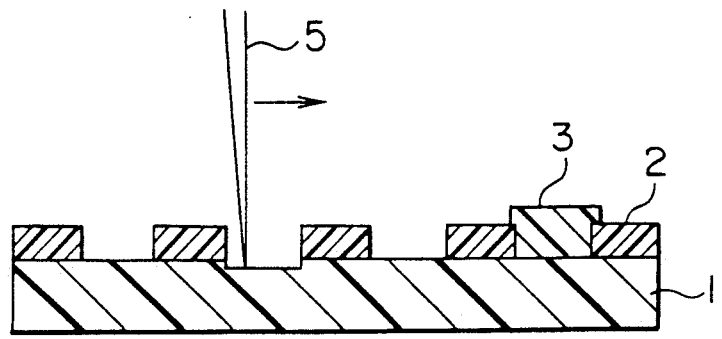
Figure 5C:
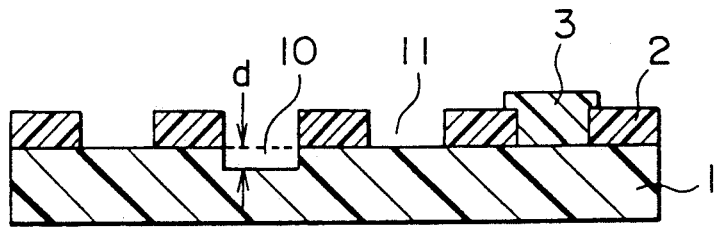

FIGS. 5A to 5C show the principle of a method of repairing a transparent defect of phase shifter patterns in accordance with an embodiment of the present invention. Reference numerals 1, 2, 3, 5, and 6 designate the same members as those described above with respect to the conventional mask repairing method. Referring to FIG. 5A, mask patterns (main patterns) 2 are formed on a quartz mask substrate 1. Phase shifter patterns 3 are intended to be formed in alternating spaces between the main patterns 2, however, in the arrangement shown in FIG. 5A, a region indicated by a reference numeral 6 is left as a transparent defect region in the phase shifter patterns 3. To repair on the transparent defect region 6, a focused ion beam 5 is introduced into the transparent defect region 6 to scan and physically etch a portion of the mask substrate 1 below the transparent defect region 6. The ion beam 5 is, for example, a 30 keV Ga+ ion beam (beam current: 300 pA, beam diameter: 0.1 μm). The clear defect region 6 is scanned with the ion beam 5 a plurality of times to etch the portion of the mask substrate 1 below this region to a predetermined depth d (nm) (FIG. 5C). Namely, the etching is performed so that the optical path difference between light passing through the etched region 10 of the mask substrate 1 and light passing through the regions (transparent patterns 11) at which the mask substrate 1 is not etched and in which no shifter patterns are formed corresponds to the product of a half wavelength of the light and an odd number. As a result of this etching, the light passing through the transparent defect region 6 and the light passing through the transparent patterns 11 adjacent to the transparent defect region 6 interfere and cancel each other, which effect is equivalent to the effect of repairing the transparent defect in the ordinary manner.

The etching depth d can be controlled by changing the time of irradiation with the ion beam 5 if the beam current is constant. The optical path difference is expressed as (n-1).d (n: refractive index of quartz glass), and the depth d may be determined from the following equation if the wavelength of the transmission light is λ (nm):

$$(n-1).d = (2m-1)\lambda/2$$

(where m = 1, 2, ...)

If i-lines of a mercury lamp light source are used, and if λ=365 nm and n=1.476 (refractive index when λ=365 nm), the depth d is set to about 383 nm. The repair of a transparent defect of the phase shifter patterns is thus effected.

Opaque defects of the phase shifter patterns may be repaired by etching and removing shifter pattern portions corresponding to the opaque defect portions alone in the same manner as the conventional method. The same apparatus can therefore be used for repairing both opaque and transparent defects which must be repaired by different processes in accordance with the conventional method. It is thereby possible to simplify the mask repair apparatus.

In the described embodiment, a 30 keV Ga+ ion beam is used as the ion beam 5. Alternatively, other ions, e.g., In+, In++, Sn+, Sn++, Au+, Au++, Si+, Si++, Be+ and Be++, may be used to obtain the same effect. Also, the energy and the current of the ion beam are not limited to the above examples and may be selected according to the conditions for optimizing the etching efficiency and the working accuracy.

What is claimed is:

1. A method of repairing a mask in which a transparent defect region of a phase shifting mask where a shifter pattern intended to be formed on a mask substrate is missing, comprising etching the substrate at the defect region with an ion beam to a depth such that the phase of light passing through the etched region is opposite to the phase of light passing through transparent regions of the substrate where no shifter patterns are formed.

2. A method according to claim 1 including selecting the ions in the ion beam from the group consisting of Ga+, In+, In++, Sn30, Sn++, Au+, Au++, Si+, Si++, Be+, and Be++.

3. A method of repairing a defective phase shifting mask where an intended shifter element of the mask substrate is missing comprising the steps of etching the substrate in the region of the defect with an ion beam to a depth corresponding to the product of half the wavelength of light passing through the etched region and an odd integer whereby light passing through the etched region interferes with and is cancelled by light passing through other elements of the phase shifting mask.

* * * * *